United States Patent
Bievenue et al.

(10) Patent No.: US 6,170,760 B1
(45) Date of Patent: Jan. 9, 2001

(54) COMPACT SPRAY VALVE

(75) Inventors: Richard John Bievenue, Burnt Hills; Jonathan N. Urquhart, Clifton Park, both of NY (US)

(73) Assignee: Precision Valve & Automation, Inc., Halfmoon, NY (US)

( * ) Notice: Under 35 U.S.C. 154(b), the term of this patent shall be extended for 0 days.

(21) Appl. No.: 09/236,257

(22) Filed: Jan. 25, 1999

(51) Int. Cl.$^7$ .................................................. B05B 7/12
(52) U.S. Cl. ...................... 239/407; 239/296; 239/408; 239/412; 239/416.5; 239/417.3; 239/418; 239/533.12; 239/584
(58) Field of Search ..................... 239/291, 296, 239/407, 408, 412, 416.5, 417.3, 418, 424.5, 533.12, 583, 584

(56) References Cited

U.S. PATENT DOCUMENTS

| | | |
|---|---|---|
| 1,305,733 | 6/1919 | Miller et al. . |
| 1,438,239 | 12/1922 | Heinrich . |
| 1,608,438 | 11/1926 | Shelburne . |
| 1,633,291 | 6/1927 | Sausen et al. . |
| 1,655,254 | 1/1928 | Binks . |
| 1,703,383 | 2/1929 | Birkenmaier . |
| 1,752,923 | 4/1930 | Mueller . |
| 1,762,282 | 6/1930 | Stephan . |
| 1,779,849 * | 10/1930 | Lusk ........................... 239/417.3 X |
| 1,990,824 | 2/1935 | Gustafsson . |
| 2,101,175 | 12/1937 | Gustafsson . |
| 2,149,181 | 2/1939 | Krautzberger . |
| 2,351,787 | 6/1944 | Smith . |
| 2,544,123 | 3/1951 | Andersson . |
| 2,613,995 | 10/1952 | Reinhold . |
| 3,396,911 | 8/1968 | Norris . |
| 3,606,154 | 9/1971 | Tufts . |
| 3,907,202 | 9/1975 | Binoche . |
| 4,200,235 | 4/1980 | Monschke . |
| 4,273,293 | 6/1981 | Hastings . |
| 4,343,433 | 8/1982 | Sickles . |
| 4,478,370 | 10/1984 | Hastings . |
| 4,836,453 * | 6/1989 | Poehlman ..................... 239/412 X |
| 5,102,053 * | 4/1992 | Linder et al. ..................... 239/412 |
| 5,169,070 | 12/1992 | Mattson . |
| 5,322,564 | 6/1994 | Ludwig et al. . |
| 5,431,343 | 7/1995 | Kubiak et al. . |
| 5,607,108 | 3/1997 | Garlick et al. . |
| 5,782,410 * | 7/1998 | Weston ........................... 239/583 X |
| 5,934,567 * | 8/1999 | Fly ................................. 239/408 |

* cited by examiner

Primary Examiner—Andres Kashnikow
Assistant Examiner—Robin O. Evans
(74) Attorney, Agent, or Firm—Schmeiser, Olsen & Watts

(57) ABSTRACT

A compact spray valve that provides an extended atomizing air cap for reaching between tightly spaced electronic components. The compact spray valve of the present invention includes an air body, a fluid control body and an extended atomizing air cap. The atomizing air cap along with a seat extension provides a plurality of laminar air flow conduits causing atomization of a fluid into a spray. The resulting spray pattern can be controlled to provide a narrow line spray pattern with clearly defined edges. Another embodiment of the present invention provides a flat spray pattern.

24 Claims, 4 Drawing Sheets

COMPACT SPRAY VALVE

FIELD OF THE INVENTION

The present invention relates generally to systems for depositing a material onto a surface, and more particularly, to spraying devices for spraying coatings onto circuit boards in the conformal coating industry.

BACKGROUND OF THE INVENTION

Uniform thickness coatings are often applied over sections of circuit boards. The coatings prevent water vapor, gases, or fluids from corroding the electrical connections on a circuit board. The coatings may comprise a wide variety of materials such as ultraviolet (UV) acrylic gels, moisture and thermal cure silicones, and the like.

The coatings are typically applied to a circuit board using devices such as spray guns or spray nozzles. Such devices generally include a liquid spray material that is atomized by compressed air and is then directed toward the surface to be coated. The spraying devices are commonly attached to an apparatus, such as a multi-degree of freedom robotic positioning apparatus, that provides accurate positional displacement relative to the article being coated.

As electronic components mounted on circuit boards become smaller, and more compactly spaced, previous large diameter spray nozzles can no longer access particular areas of a circuit board. Some tall electronic components protrude a considerable distance from the circuit board. When two or more of these tall electronic components are closely spaced, a large diameter spray nozzle cannot fit between the electronic components. Furthermore, there is now a requirement for providing a small diameter spray pattern with clearly defined edges to provide the accuracy and precision required to produce the spray in the narrowly defined space created by the closely spaced electronic components.

SUMMARY OF THE INVENTION

In order to overcome the above deficiencies, the present invention provides a compact spray valve that produces a small diameter spray pattern using an extended atomizing air cap. The extended atomizing air cap can reach between tall closely spaced electronic components, and can thereby apply spray to the circuit board between the components. The compact spray valve of the present invention includes an air body, a fluid control body, and an extended atomizing air cap. The extended atomizing air cap has a small outside diameter combined with a long length, allowing the extended atomizing air cap to reach between tall and closely spaced electronic components on a circuit board.

In the air body of the compact spray valve, a piston is attached to a fluid control needle. The fluid control needle protrudes from the air body and enters into the fluid control body where the tip of the fluid control needle is received in a valve seat. Pressurized air is selectively applied to the top or the bottom of the piston causing the piston to move in an upward or downward direction, thereby causing the tip of the fluid control needle to move into or out of the valve seat.

In the fluid control body, material to be applied to a surface is supplied in a fluid form. The material flow is controlled by the location of a tip of the fluid control needle. When pressurized air is applied to the top of the piston in the air body, the fluid control needle is moved in a downward direction until the tip of the fluid control needle is fully seated in the valve seat, thereby stopping the flow of material. When pressurized air is applied to the bottom of the piston in the air body, the tip of the fluid control needle is moved upward out of the valve seat, allowing material to flow through the valve seat into an atomizing space. At the same time, compressed air is supplied to the extended atomizing air cap. The extended atomizing air cap is attached to the lower portion of the fluid control body by a threaded retaining ring. The compressed air flows through the extended atomizing air cap and into the atomizing space causing the fluid stream to be atomized into a spray.

For generating a round spray pattern, a plurality of longitudinal air conduits are formed between a cylindrical outer body of a seat extension and a fluted interior surface of the extended atomizing air cap. The longitudinal air conduits create laminar flow air columns that eject into the atomizing space and atomize the material. The atomized material flows out through a round opening in the atomizing air cap producing a round spray pattern with distinctly defined edges. This round spray pattern is then projected onto a circuit board surface.

For generating a flat spray pattern, an extended flat spray atomizing air cap, hereafter referred to as a "flat spray air cap", is attached to the fluid control body. In the flat spray air cap, a plurality of longitudinal air conduits are formed between a cylindrical outer body of a seat extension and a fluted interior surface of the flat spray air cap. The longitudinal air conduits create laminar flow air columns that eject into the atomizing space to atomize the fluid. The flat spray air cap also has side air passages that provide inwardly directed jets of air which cause the atomized spray to form into a flat spray pattern in the atomizing space. This flat spray pattern is then projected onto the circuit board surface.

BRIEF DESCRIPTION OF THE DRAWINGS

The features of the present invention will best be understood from a detailed description of the invention and a preferred embodiment thereof selected for the purposes of illustration and shown in the accompanying drawings in which.

DETAILED DESCRIPTION OF THE INVENTION

Figure 1:
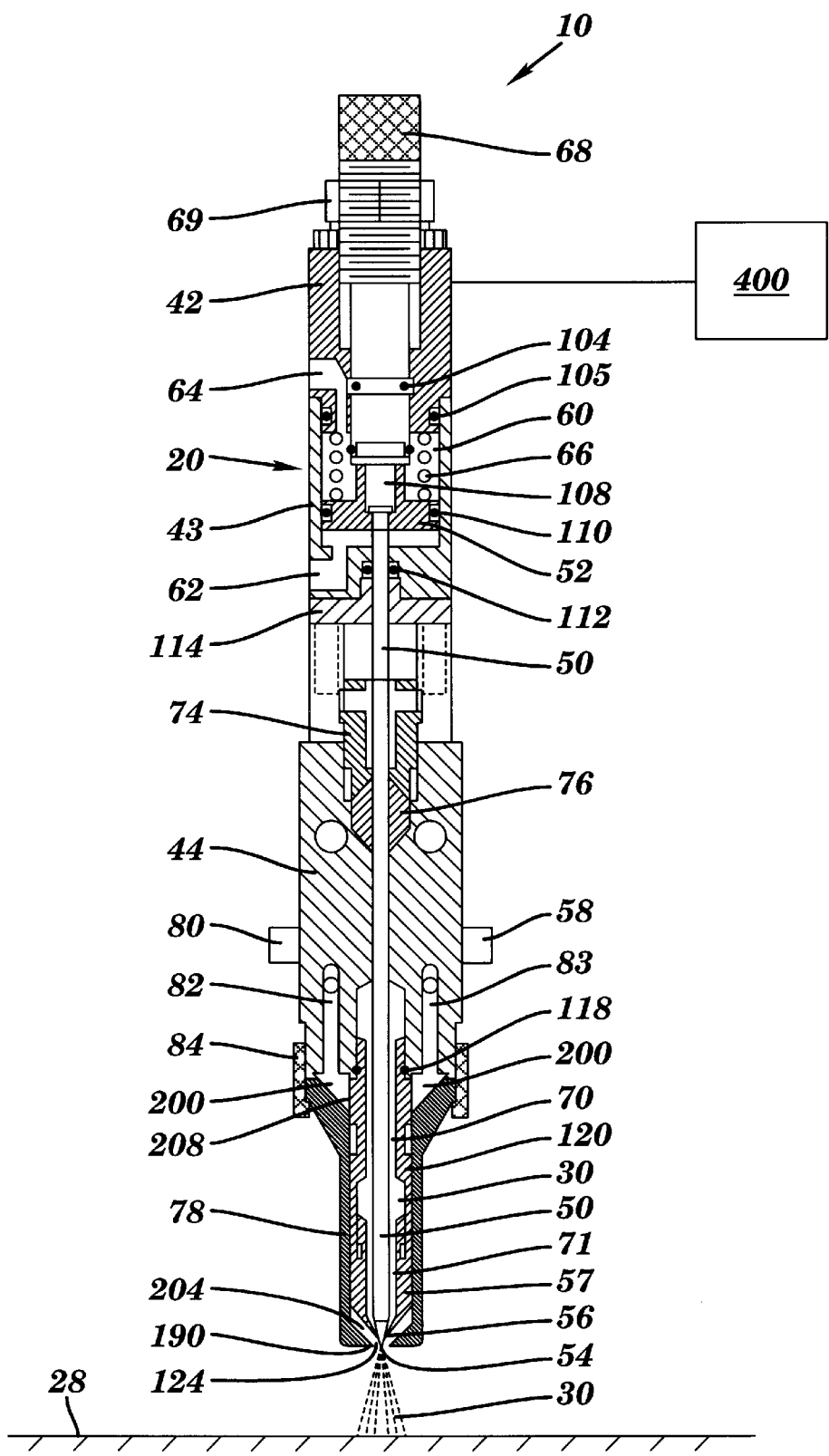
FIG. 1 is a partial cross-sectional front view of a compact spray valve in accordance with a preferred embodiment of the present invention, wherein the compact spray valve is in a spraying position.

Although certain preferred embodiments of the present invention will be shown and described in detail, it should be understood that various changes and modifications may be made without departing from the scope of the appended claims. The scope of the present invention will in no way be limited to the number of constituting components, the materials thereof, the shapes thereof, the relative arrangement thereof, etc., and are disclosed simply as an example of the preferred embodiment. The features and advantages of the present invention are illustrated in detail in the accompanying drawings, wherein like reference numerals refer to like elements throughout the drawings.

Referring to FIG. 1, there is illustrated a partial cross-sectional front view of a compact spray valve 10 in accordance with a preferred embodiment of the present invention. The compact spray valve 10 includes an air body 20, a fluid control body 44 and an extended atomizing air cap 78 for producing a small diameter round spray pattern with clearly defined edges. The air body 20 includes an upper air body 42, a lower air body 43 and an end cap 114.

Figure 2:
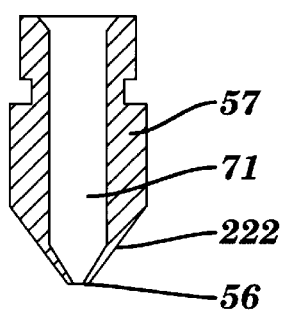
FIG. 2 is a cross-sectional view of a valve seat body.

In the air body 20 of the compact spray valve 10, a piston 52 is attached to a fluid control needle 50 with a set screw 108. The fluid control body 44 includes a packing nut 74 and packing material 76 to guide and center the fluid control needle 50 within the fluid control body 44, and to provide a seal to prevent leakage of fluid material 30 from the fluid body 44. A seat extension 120 is attached to the lower end of the fluid control body 44. The seat extension 120 includes a central axial hole 70 that receives fluid material 30 and the fluid control needle 50. A seal 118 prevents leakage of compressed air from passages 82 and 83 past the seat extension 120. A valve seat body 57, illustrated in FIGS. 1 and 2, is attached to the lower end of the seat extension 120. The seat extension 120 positions the valve seat body 57 near the end of the extended atomizing air cap 78. A central axial hole 71 in the valve seat body 57 receives fluid material 30 and the fluid control needle 50. The lower end of the valve seat body 57 includes a valve seat 56 that can receive the tip 54 of the fluid control needle 50.

Fluid material 30 is supplied under pressure to the fluid control body 44 through a material inlet port 58. The inlet port is connected to the central axial hole 70 of the seat extension 120. When the tip 54 of the fluid control needle 50 is moved upward, and is no longer seated in the valve seat 56, the fluid material 30 is allowed to flow into an atomizing space 124. In the atomizing space 124, the fluid material 30 is converted into an atomized state by a plurality of jets of compressed air.

The fluid control needle 50 is preferably displaced within the air body 20 using compressed air. Other known methods may also be employed. Specifically, the piston 52, which is attached to an end of the fluid control needle 50, is displaced upward within a piston bore 60 in the air body 20 by supplying compressed air to a lower air port 62 in the air body 20. This results in the upward displacement of the fluid control needle 50, and the corresponding removal of the tip 54 of the fluid control needle 50 from the valve seat 56, thereby allowing the fluid material 30 to flow into the atomizing space 124. Analogously, the piston 52 is displaced downward within the piston bore 60 in the air body 20 by supplying compressed air to an upper air port 64 in the air body 20. In response to the downward displacement of the piston 52, the tip 54 of the fluid control needle 50 is positioned within the valve seat 56, thereby preventing the fluid material 30 from flowing into the atomizing space 124. Seals 104, 105 and 112 prevent leakage of compressed air from the air body 20. Seal 110 prevents leakage of compressed air between the piston 52 and the piston bore 60.

A spring 66 is preferably installed between the top of the piston 52 and the upper interior surface of the piston bore 60. The spring 66 provides a biasing force against the piston 52, such that if no compressed air is supplied to the air ports 62 and 64, the piston 52 will automatically be moved in a downward direction to position the tip 54 of the fluid control needle 50 within the valve seat 56, thereby shutting off the material flow. This provides a fail safe mode, whereby if the unit were to loose compressed air, the material 30 flow would be automatically stopped.

A threaded body stroke adjuster 68 is provided to adjustably limit the upper displacement of the piston 52 and attached fluid control needle 50 to control the amount of fluid material 30 flowing into the atomizing space 124. A lock nut 69 is used to lock the threaded body stroke adjuster 68 in a selected position. A computerized control system (not shown) may also be provided to programmably regulate the threaded body stroke adjuster 68 to control the material 30 flow.

Compressed air is supplied to the fluid body 44 through an atomizing air inlet port 80 which is connected to air passages 82 and 83. The extended atomizing air cap 78 is removably attached to the fluid body 44 with a threaded retaining ring 84.

Figure 4:
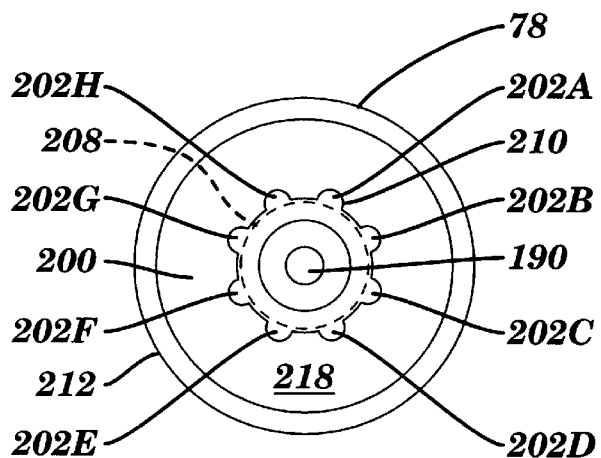
FIG. 4 is a top view of the extended atomizing air cap of FIG. 3.
Figure 3:
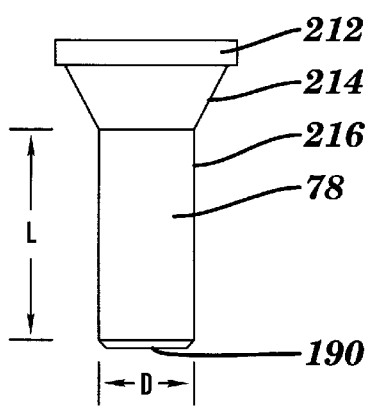
FIG. 3 is a side view of an extended atomizing air cap in accordance with the present invention, configured to provide a round spray pattern.

A side view of the extended atomizing air cap 78 is illustrated in FIG. 3, and a top view of the extended atomizing air cap 78 is illustrated in FIG. 4. As illustrated in FIG. 3 the length of the vertical extension 216 of the extended atomizing air cap 78 is denoted "L", and the outer diameter of the vertical extension 216 of the extended atomizing air cap 78 is denoted "D". Preferably, for the extended atomizing air cap 78 of the present invention, the value of the diameter D is about 0.425 inches and value of the length L is about 1.0 inches. Therefore the ratio of L/D has a value of about 2.35. Preferably the ratio of L/D has a value greater than about 1.5 and an optimal value in the range of about 1.0 to 3.0. This ratio allows the extended atomizing air cap 78 to reach between tall compactly spaced electronic components mounted on a circuit board. In comparison, currently available atomizing air caps on spray guns typically have L/D values of less than 1.

Included in the extended atomizing air cap 78 illustrated in FIG. 3 is a collar 212, a tapered inlet 214, the vertical extension 216, and a lower opening 190. The lower opening 190 in the extended atomizing air cap 78 is where the fluid material 30 leaves the extended atomizing air cap 78 in an atomized state and is directed toward the surface 28. The threaded retaining ring 84 illustrated in FIG. 1, fastens the collar 212 of the extended atomizing air body 78 to the fluid control body 44.

Figure 5:
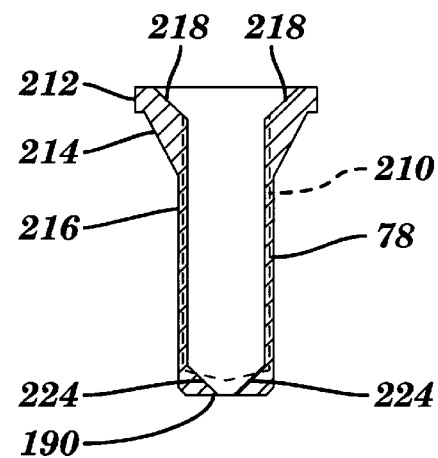
FIG. 5 is a cross-sectional view of the extended atomizing air cap of FIG. 3.

FIG. 5 is a cross-sectional side view of the atomizing air cap 78 of FIG. 3. A converging inlet surface 218 is included in the tapered inlet 214. The converging inlet surface 218 gathers compressed air entering the extended atomizing air cap 78 from air passages 82 and 83 in the fluid control body 44. The extended atomizing air cap 78 includes a fluted inner surface 210 for generating laminar jets of compressed air.

FIG. 4 illustrates a top view of the extended air cap 78 in combination with an outer surface 208 of the seat extension 120 shown in phantom. The fluted inner surface 210 of the extended atomizing air cap 78, in combination with the outer surface 208 of the seat extension 120, form air conduits 202A, 202B, 202C, 202D, 220E, 220F, 202G and 202H. The fluted inner surface 210 is preferably formed from a plurality of semi-circular depressions extending from a cylindrical surface. In the present invention the diameter of each semi-circular depression is about 0.062 inches.

Figure 6:
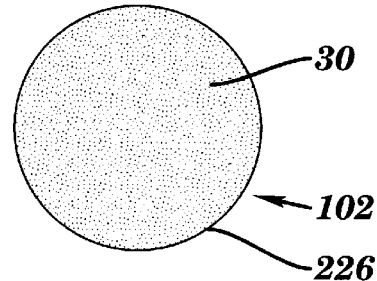
FIG. 6 is a top view of the round spray pattern produced using the extended atomizing air cap of FIG. 3.

Compressed air from the atomizing air inlet port 80 travels through air passages 82 and 83 into space 200. From space 200 the compressed air travels through the air conduits 202A–202H to an air passage 204 (FIG. 1). The air passage 204 is formed between a conical wall 222 of the valve seat body (FIG. 2) and the outlet surface 224 of the extended atomizing air body 78 (FIG. 5). The compressed air travels in a laminar flow fashion through each of the air conduits 202A–202H and then exits as a jet from each air conduit 202A–202H to cause atomization of the fluid material 30 in the atomizing space 124. The atomized fluid material 30 impinges on the surface 28 in a round spray pattern 102 as illustrated in FIG. 6. The laminar flow of the jets of compressed air produce a round spray pattern 102 with a distinct clearly defined outer edge 226. Furthermore, the spray pattern provided by the extended atomizing air cap 78 can now be smaller than about ⅛ inch in diameter.

The compact spray valve is commonly attached to an apparatus, such as a multi-degree of freedom robotic positioning apparatus, that provides accurate positional displacement relative to the article being coated. Therefore, when the compact spray valve is moved in a horizontal direction relative to a surface, the round spray can create a line narrower than about ⅛ inch. The atomizing air cap has a small diameter with an extended height allowing access to spaces on the circuit board between closely spaced and tall electronic components previously not accessible using currently available end caps.

In the preferred embodiment of the present invention, the maximum supply pressure of the fluid material 30 is about 3500 psi and the compressed air pressure supplied to the upper air port 64 or the lower air port 62 of the air body 42 is between about 30 to 100 psi. The air pressure supplied to the air inlet port 80 of the atomizing air body is about 0 to 35 psi.

Figure 7:
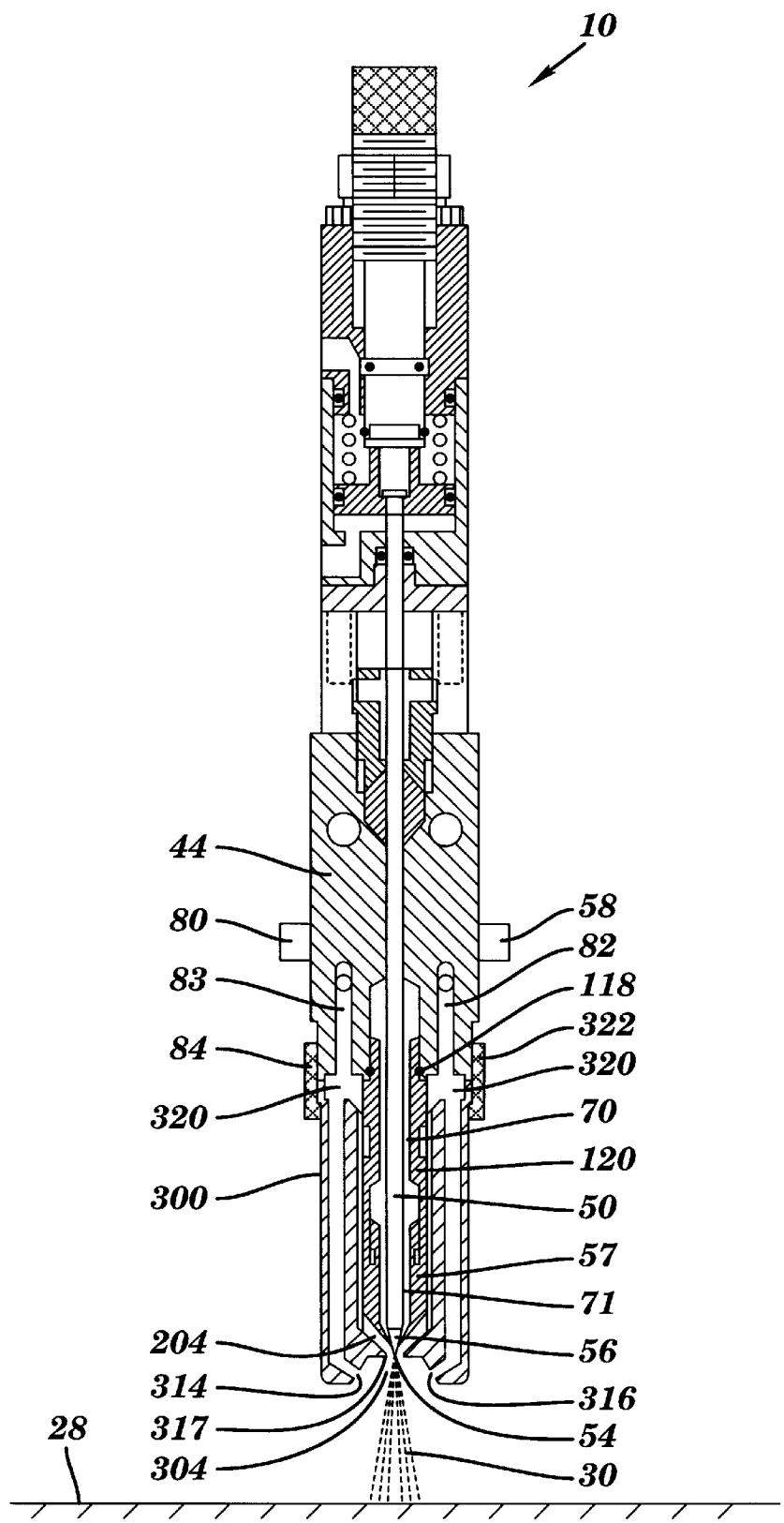
FIG. 7 is a partial cross-sectional side view of another embodiment of the present invention, wherein the compact spray valve is configured to provide a flat spray pattern.

FIG. 7 is a partial cross-sectional side view of another embodiment of the present invention, wherein the compact spray valve 10 is configured to provide a flat spray pattern. A flat spray air cap 300 is removably attached to the fluid body 44 by the threaded retainer ring 84. Fluid material 30 is supplied under pressure to the fluid control body 44 through the material inlet port 58. The inlet port 58 is connected to the central axial hole 70 in the seat extension 120. The fluid material 30 flows down through the central axial hole 70 in the seat extension 120 and down through the central hole 71 in the valve seat body 57. The lower end of the valve seat body 57 includes a valve seat 56 that can receive the tip 54 of the fluid control needle 50. When the tip 54 is lifted from the valve seat 56, fluid material 30 flows into the atomizing space 304.

As illustrated in FIG. 7, compressed air is supplied to the fluid body 44 through an atomizing air inlet port 80 which is connected to the air passages 82 and 83. The air passages 82 and 83 are connected to space 320.

Figure 9:
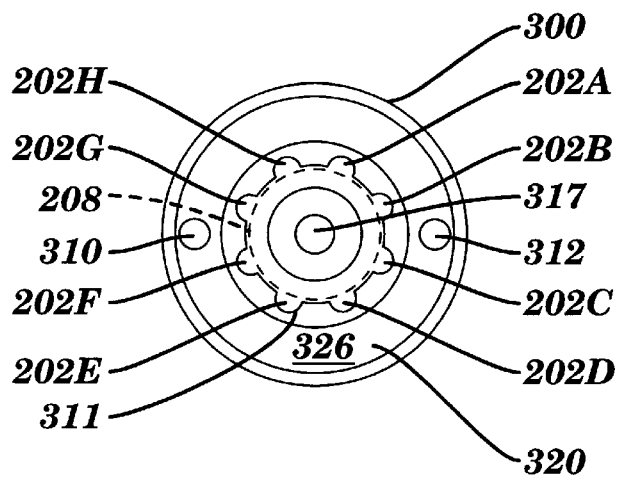
FIG. 9 is a top view of the flat spray air cap of FIG. 8.
Figure 8:
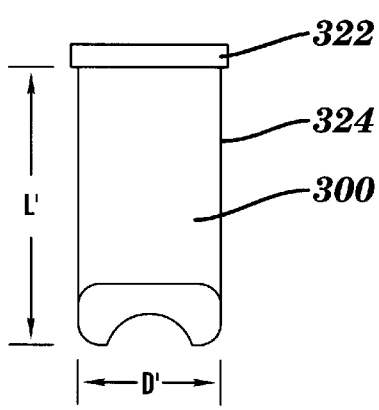
FIG. 8 is a side view of a flat spray air cap in accordance with the present invention.
Figure 10:
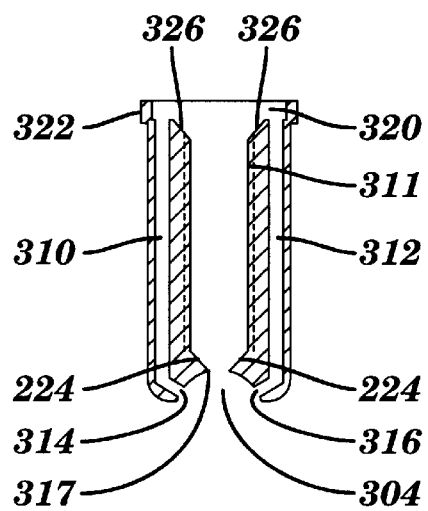
FIG. 10 is a cross-sectional side view of the flat spray air cap of FIG. 8.
Figure 11:
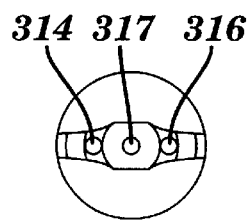
FIG. 11 is a bottom view of the flat spray air cap of FIG. 8.

A side view of the flat spray air cap 300 is illustrated in FIG. 8, and a top view of the flat spray atomizing air cap 300 is illustrated in FIG. 9. A lower opening 317 for ejecting fluid material 30 in an atomized state from the flat spray air cap 300 is shown in FIGS. 9, 10 and 11. As illustrated in FIG. 8, the length of the vertical extension 324 of the atomizing air cap 300 is denoted "L'", and the diameter of the atomizing air cap 300 is denoted "D'". Preferably, for the flat spray air cap 300 of the present invention, the value of the diameter D' is about 0.746 inches and value of the length L is about 1.425 inches. Therefore the ratio of L'/D' is about 1.91. In comparison, previously available atomizing air caps on spray guns typically have L/D values of less than 1.

Included in the flat spray air cap 300 is a collar 322, the vertical extension 324, the lower opening 317, and openings 314 and 316. Compressed air is ejected from openings 314 and 316. The threaded retaining ring 84 illustrated in FIG. 7, fastens the collar 322 of the flat spray air cap 300 to the fluid control body 44.

FIG. 10 is a cross-sectional side view of the flat spray atomizing air cap 300 of FIG. 8. Compressed air from air passages 82 and 83 enters the interior region 320 of the collar 322, and is directed to a fluted inner surface 311 by a converging inlet surface 326 in the vertical extension 324. Also the compressed air flows through side air passages 310 and 312.

FIG. 9 illustrates a top view of the flat spray air cap 300 in combination with the outer surface 208 of the seat extension 120 shown in phantom. The fluted inner surface 311 of the flat spray air cap 300, in combination with the outer surface 208 of the seat extension 120, form air conduits 202A, 202B, 202C, 202D, 202E, 202F, 202G and 202H. The fluted inner surface 311 is preferably formed from a plurality of semi-circular depressions extending from a cylindrical surface. In the present invention the diameter of each semi-circular depression is about 0.062 inches.

Compressed air from the atomizing air inlet port 80 travels through air passages 82 and 83 into space 320. From space 320 the compressed air travels through the air conduits 202A–202H to the air passage 204 (FIG. 7). The air passage 204 is formed between the conical wall 222 of the valve seat (FIG. 2), and the outlet surface 224 located in the flat spray air cap 300 (FIG. 10). The compressed air travels in a laminar flow fashion through each of the air conduits 202A–202H and then exits as a jet from each air conduit 202A–202H to cause atomization of the fluid material 30 in the atomizing space 304.

Figure 12:
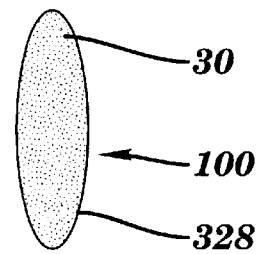
FIG. 12 is a top view of the flat spray pattern produced using the flat spray air cap of FIG. 8.

The side air passages 310 and 312 lead from the space 320 to openings 314 and 316 illustrated in FIG. 10. The openings 314 and 316 are located at the sides of the atomizing space 304. The openings 314 and 316 can be circular as shown in FIG. 11. The air jets from the conduits 202A–202H primarily supply compressed air to atomize the fluid material 30, while the compressed air from the openings 314 and 316 primarily shape the atomized spray pattern of the fluid material 30. The atomized fluid material 30 impinges on the surface 28 in a flat spray pattern 100 as illustrated in FIG. 12. The laminar flow of the jets of compressed air along with the compressed air from the openings 314 and 316 produce a flat spray pattern 100 with a distinct clearly defined outer edge 328.

The foregoing description of the present invention has been presented for purposes of illustration and description. It is not intended to be exhaustive or to limit the invention to the precise form disclosed, and many modifications and variations are possible in light of the above teaching. For instance, the compact spray valve of the present invention is not limited to applying ultraviolet (UV) acrylic gels, and moisture and thermal cure silicones to circuit boards, but also can used to spray other materials such as paints, oils, inks, etc. The compact spray valve can also be used to spray materials onto other surfaces besides circuit boards. The compact spray valve of the present invention can spray materials with viscosities in the range from about 0 centipoise to about 50,000 centipoise. Such modifications and variations that may be apparent to a person skilled in the art are intended to be included within the scope of this invention as defined by the accompanying claims.

We claim:

1. An apparatus comprising:
   an extended atomizing air cap for a spray valve including a vertical extension including a fluted interior surface for generating a plurality of laminar flow air jets; a lower opening for discharging material atomized by the plurality of laminar flow air jets; and seat extension for positioning a valve seat near the lower the lower opening.

2. An apparatus according to claim 1, wherein a ratio of a length of the vertical extension to a diameter of the vertical extension has a value of at least about 1.5.

3. An apparatus according to claim 1, further including a system for selectively supplying the material through the valve seat.

4. An apparatus according to claim 1, wherein an outer surface of the seat extension contacts the fluted interior surface of the vertical extension to form the plurality of laminar flow air jets.

5. An apparatus according to claim 1, further including a tapered inlet in a top portion of the vertical extension to direct air to the fluted interior surface.

6. An apparatus according to claim 1, further including a collar for attaching the vertical extension to a spray valve.

7. An apparatus according to claim 1, further including a plurality of side air jets for directing the atomized material onto a surface in a predetermined pattern.

8. A spraying system comprising;
   a material control system for selectively supplying material to be atomized to material discharging system located in an extended atomizing air cap;
   a compressed air system for supplying compressed air to the extended atomizing air cap to atomize the material;
   wherein the extended atomizing air cap comprises a vertical extension including a fluted interior surface for forming a plurality of laminar flow air jets from the supplied compressed air, a lower opening for discharging the material into the laminar flow air jets to atomize the material, and a seat extension for positioning a valve seat near the lower opening.

9. An spraying according to claim 8, wherein a ratio of a length of the vertical extension to a diameter of the vertical extension has a value of at least about 1.5.

10. The spraying system of claim 8, wherein the material control system includes a material inlet and a valve system for selectively supplying the material from the material inlet to the material discharging system.

11. The spraying system according to claim 8, wherein the spraying system is attached to a multi-degree of freedom positioning apparatus system.

12. The spraying system according to claim 8, wherein the material control system further includes a control member, and a system for selectively positioning the control member relative to the valve seat to control the passage of material from the material inlet to the material discharging system.

13. The spraying system according to claim 12, wherein the positioning system inserts an end portion of the control member in the valve seat to prevent the material from passing from a material inlet to the material discharging system, and wherein the positioning system withdraws the end portion of the control member from the valve seat to allow the material to pass from the material inlet to the material discharging system.

14. The spraying system according to claim 13, further including a biasing mechanism for automatically positioning the control member in the valve seat to prevent the material from passing from the material inlet to the material discharging system.

15. The spraying system according to claim 8, wherein an outer surface of the seat extension contacts the fluted interior surface of the vertical extension to form the plurality of laminar air jets.

16. The spraying system according to claim 8, further including a tapered inlet in a top portion of the vertical extension to direct the compressed air to the fluted interior surface.

17. The spraying system according to claim 8, further including a plurality of side air jets for directing the atomized material onto a surface in a predetermined pattern.

18. A method for spraying material from an outlet of an extended atomizing air cap, comprising the steps of:
   providing an extended atomizing cap;
   generating a plurality of laminar flow air jets within the extended atomizing air cap;
   introducing material into the plurality of laminar flow air jets to produce an atomized spray; and
   projecting the atomized spray toward a surface; and
   providing a plurality of side air jets for directing the atomized material onto a flat spray pattern on the surface.

19. A spraying system comprising;
   a material control system for selectively supplying material to be atomized to a material discharging system located in an extended atomizing air cap;
   a compressed air system for supplying compressed air to the extended atomizing air cap to atomize the material;
   wherein the extended atomizing cap comprises a vertical extension including a fluted interior surface for forming a plurality of laminar flow air jets from the supplied compressed air, a lower opening for discharging the material into the laminar flow air jets to atomize the material, and wherein the spraying system is attached to a multi-degree of freedom positioning apparatus system.

20. A method for spraying material form an outlet of an extended atomizing air cap, comprising the steps of:
   providing an extended atomizing air cap;
   generating atomizing a plurality of laminar flow air jets within the extended atomizing air cap;
   introducing material into the plurality of laminar flow air jets to produced an atomized spray; and
   projecting the atomized spray toward a surface to form a round spray pattern.

21. A spraying system comprising;
   a material control system for selectively supplying material to be atomized to a material discharging system located in an extended atomizing air cap;
   a compressed air system for supplying compressed air to the extended atomizing air cap to atomize the material;
   wherein the extended atomizing air cap comprises a vertical extension including a fluted interior surface for forming a plurality of laminar flow air jets from the supplied compressed air, a lower opening for discharging the material into the laminar flow air jets to atomize the material, and a tapered inlet in a top portion of the vertical extension to direct the compressed air to the fluted interior surface.

22. A spraying system comprising;
a material control system for selectively supplying material to be atomized to a material discharging system located in an extended atomizing air cap, wherein the material control system includes a material inlet and a valve system for selectively supplying the material from the material inlet to the material discharging system;
a compressed air system for supplying compressed air to the extended atomizing air cap to atomize the material;
wherein the extended atomizing air cap comprises a vertical extension including a fluted interior surface for forming a plurality of laminar flow air jets from the supplied compressed air, and a lower opening for discharging the material into the laminar flow air jets to atomize the material.

23. An apparatus comprising:
an extended atomizing air cap for a spray valve including a vertical extension including a fluted interior surface for generating a plurality of laminar flow air jets; a lower opening for discharging material atomized by the plurality of laminar flows air jets; and a tapered inlet in top portion of the vertical extension to direct air to the fluted interior surface.

24. An apparatus comprising:
an extended atomizing air cap for a spray valve including a vertical extension including a fluted interior surface for generating a plurality of laminar flow air jets; a lower opening for discharging material atomized by the plurality of laminar flow air jets; and a collar for attaching the vertical extension to a spray valve.

* * * * *

UNITED STATES PATENT AND TRADEMARK OFFICE
CERTIFICATE OF CORRECTION

PATENT NO. : 6,170,760 B1
DATED : January 9, 2001
INVENTOR(S) : Richard John Bievenue et al.

It is certified that error appears in the above-identified patent and that said Letters Patent is hereby corrected as shown below:

Claim 1,
Line 7, please delete the first case of "the lower"

Claim 8,
Line 3, please insert -- a -- between "to" and "material"

Claim 9,
Line 1, please insert -- system -- following the word "spraying"

Claim 20,
Line 1, please change "form" to -- form --

Claim 23,
Line 6, please insert -- a -- following the word "in"

Signed and Sealed this

Twelfth Day of March, 2002

Attest:

Attesting Officer

JAMES E. ROGAN
Director of the United States Patent and Trademark Office

UNITED STATES PATENT AND TRADEMARK OFFICE
CERTIFICATE OF CORRECTION

PATENT NO. : 6,170,760 B1 Page 1 of 1
DATED : January 9, 2001
INVENTOR(S) : Bievenue et al.

It is certified that error appears in the above-identified patent and that said Letters Patent is hereby corrected as shown below:

<u>Column 8,</u>
Line 45, delete "atmomizing".
Line 48, delete "produced" and insert -- produce --.

<u>Column 10,</u>
Line 6, delete "flows" and insert -- flow --.

Signed and Sealed this

Tenth Day of August, 2004

JON W. DUDAS
*Acting Director of the United States Patent and Trademark Office*